United States Patent [19]

Sakashita

[11] Patent Number: 4,778,382

[45] Date of Patent: Oct. 18, 1988

[54] APPARATUS FOR AUTOMATIC BAKING TREATMENT OF SEMICONDUCTOR WAFERS

[75] Inventor: Takeshi Sakashita, Itami City, Japan

[73] Assignee: Mitsubishi Denki Kabushiki Kaisha, Japan

[21] Appl. No.: 148,122

[22] Filed: Jan. 27, 1988

Related U.S. Application Data

[63] Continuation of Ser. No. 924,323, Oct. 29, 1986, abandoned.

[30] Foreign Application Priority Data

Oct. 30, 1985 [JP] Japan ................................. 60-245540

[51] Int. Cl.[4] ............................................. F27D 5/00
[52] U.S. Cl. ........................................ 432/239; 432/6; 432/253; 432/152; 414/156
[58] Field of Search ................. 432/5, 6, 176, 184, 432/152, 153, 239, 243, 253; 414/152, 156

[56] References Cited

U.S. PATENT DOCUMENTS

| | | | |
|---|---|---|---|
| 3,934,733 | 1/1976 | Worden | 432/239 |
| 4,439,146 | 3/1984 | Sugita | 432/6 |
| 4,484,538 | 11/1984 | Sarkozy et al. | 432/253 |
| 4,516,897 | 5/1985 | Snider et al. | 432/239 |
| 4,518,349 | 5/1985 | Tressler et al. | 432/239 |
| 4,523,885 | 6/1985 | Bayne et al. | 432/239 |
| 4,610,628 | 9/1986 | Mizushina | 432/6 |

Primary Examiner—Henry C. Yuen
Attorney, Agent, or Firm—Leydig, Voit & Mayer

[57] ABSTRACT

An apparatus for baking treatment of semiconductor wafers comprises a furnace portion and a conveyor portion. The furnace portion has a baking chamber in which is installed a turntable on which baking cassettes are supported during baking treatment and a mechanism for circulating hot air through the baking chamber. The conveyor portion has a conveyor mechanism which moves cassettes for transporting wafers along a path from an entrance to an exit of the conveyor portion, a transferring mechanism which can transfer wafers from a cassette for transporting wafers to a baking cassette and vice versa, and a cassette insertion and removal mechanism for inserting and removing a baking cassette from the baking chamber of the furnace portion and mounting it on and removing it from the turntable. The operation of the apparatus is controlled by a CPU in such a manner that immediately after the baking treatment is completed in the furnace portion, the baking cassette is removed from the furnace portion and the wafers contained therein are transferred to a transporting cassette which is maintained at ambient temperature to shorten the time required to cool the wafers.

10 Claims, 9 Drawing Sheets

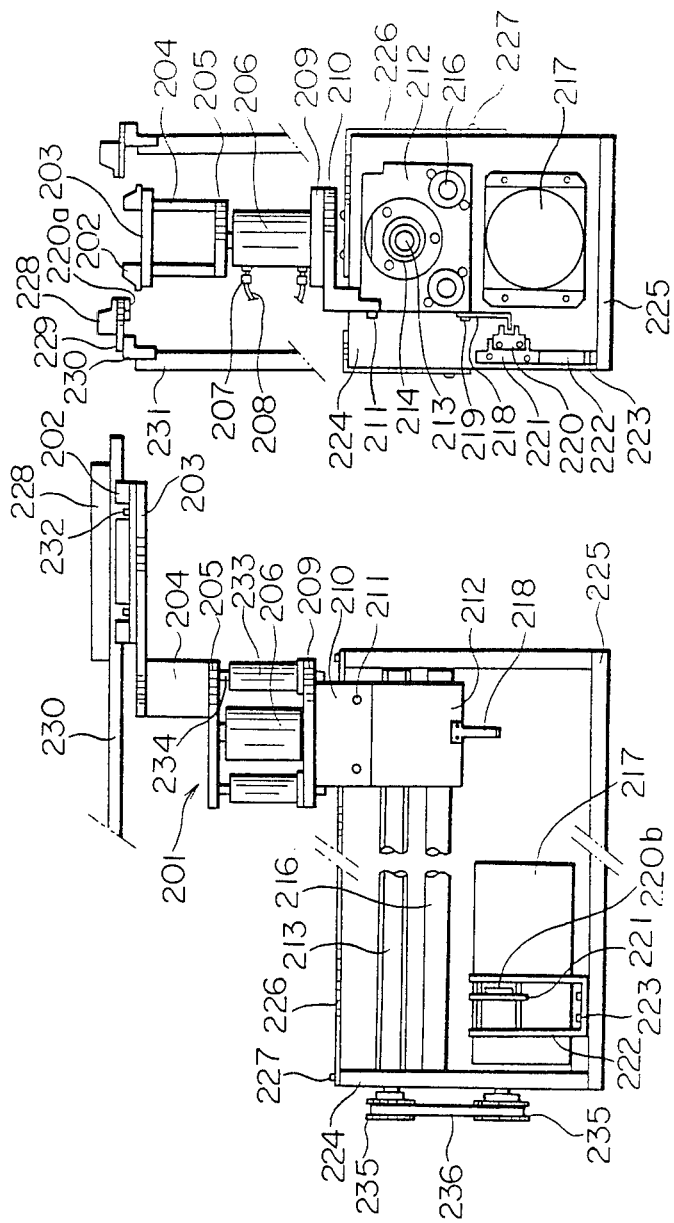

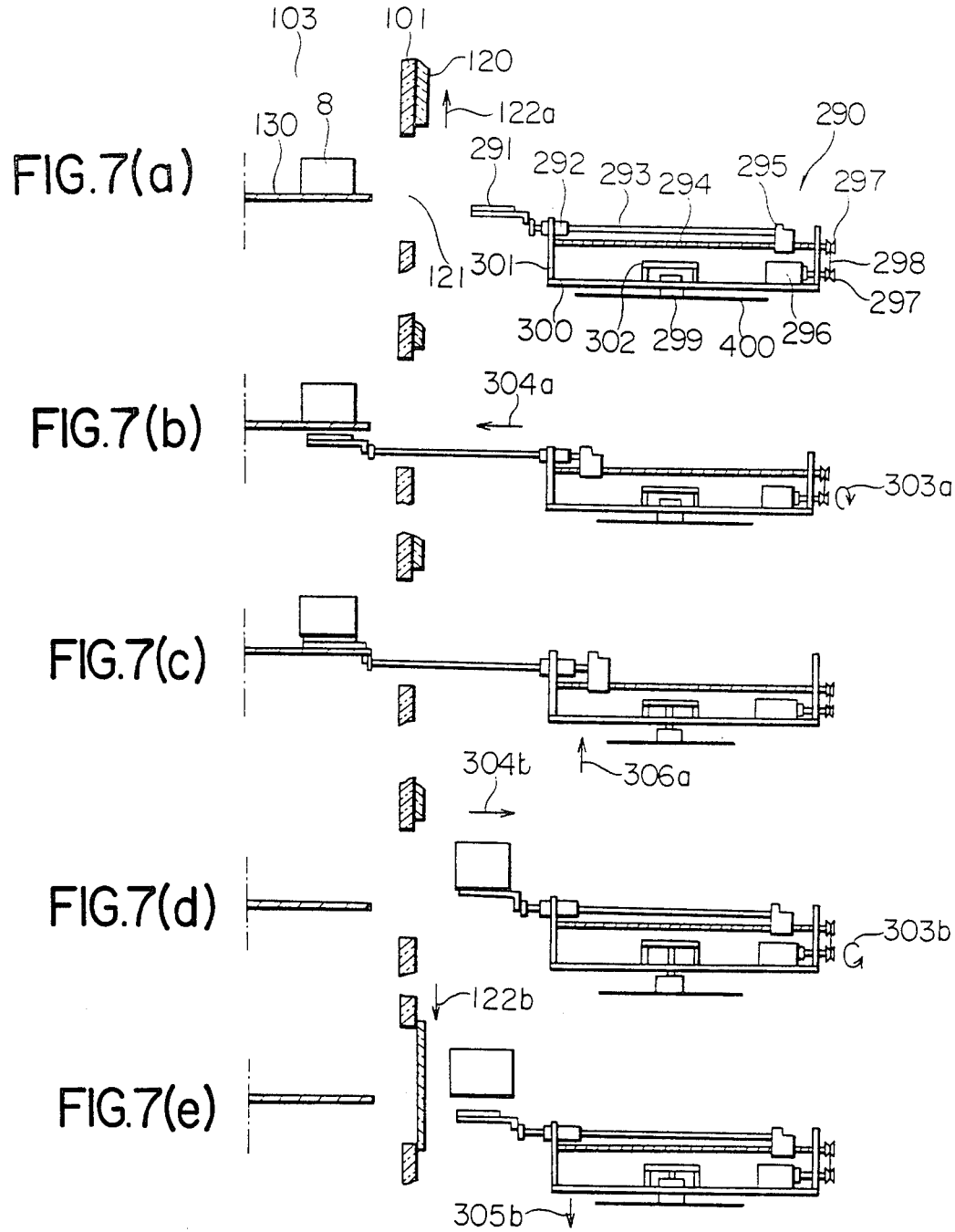

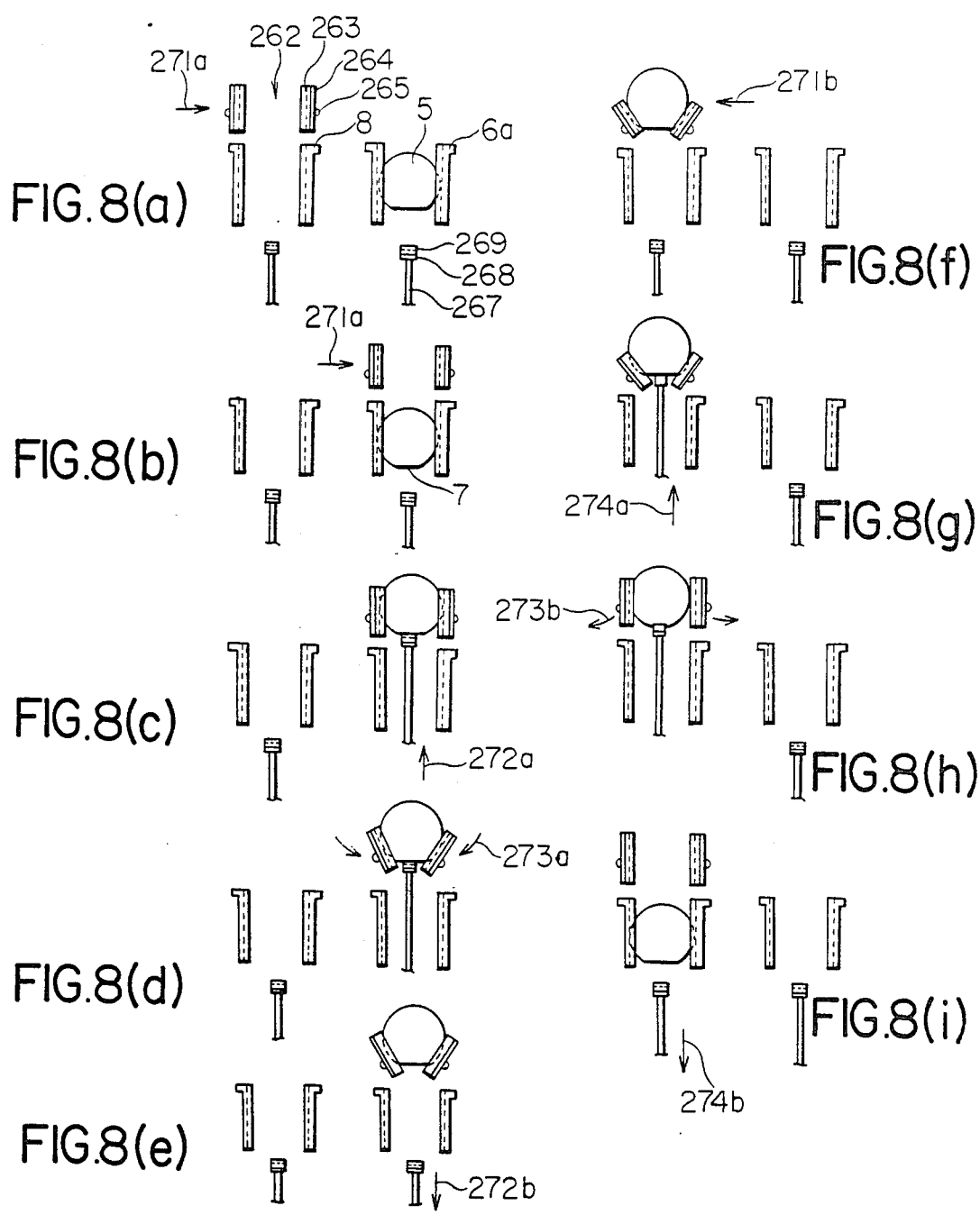

FIG. 9(a)
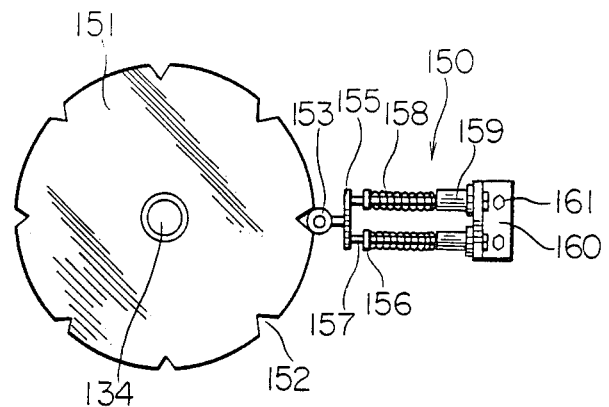
FIG. 9(b)
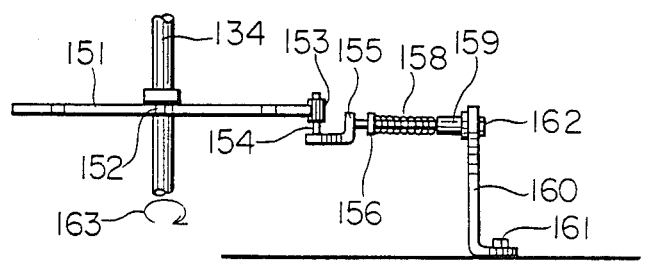
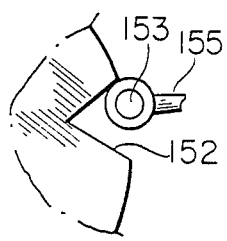
FIG. 9(c)

APPARATUS FOR AUTOMATIC BAKING TREATMENT OF SEMICONDUCTOR WAFERS

This application is a continuation of application Ser. No. 924,323, filed Oct. 29, 1986, now abandoned.

BACKGROUND OF THE INVENTION

This invention relates to an apparatus for automatically baking semiconductor wafers in order to improve the adhesion between a mask material and the wafer.

In the manufacture of semiconductor devices, prior to photoengraving, etching, or ion implantation, baking treatment is carried out in order to increase the adhesion between the mask material and the wafer. There are various processes for performing baking treatment, including sheet treatment in which wafers are treated one at a time and batch treatment in which wafers are inserted into a cassette prior to treatment and the entire cassette is inserted into a baking furnace so that a large number of wafers can be treated at a single time. This invention relates in particular to an apparatus for use in batch treatment.

Conventionally, during baking treatment, as shown in FIG. 1, a silicon wafer (hereinunder referred to as a "wafer") is inserted into one of a number of slots 2 formed in a Teflon cassette 1 (hereinunder referred to as a "TF cassette") and undergoes baking treatment in a baking furnace 10 like that shown in FIG. 2 in cross section.

In FIG. 2, a TF cassette 1 containing a wafer 5 is mounted on a rack 22 for cassettes in the furnace interior 21. An air intake port 23 is provided below the rack 22, and a heater 16 is installed inside the air intake port 23. An air blower 13 is installed beneath the furnace interior 21, near the heater 16. The air blower 13 is driven by a motor 11 which is connected to the air blower 13 by an output shaft 12. The air blower 13 is positioned in the middle of a duct 15 which extends upwards to the top of the furnace 10 and communicates with the upper portion of the furnace interior 21. A filter 14 is provided at the upper portion of the duct 15. Air passes from the duct 15 into the furnace interior 21 via the filter 14 and an unillustrated air discharge port.

A temperature-sensing element 17 for measuring the temperature in the furnace interior 21 is installed on the inner wall of the furnace 10 near the racks 22 for cassettes. The furnace interior 21 is surrounded by thermal insulation 25. An opening is formed in one of the walls of the baking furnace 10, and a door 18 with a handle 19 is mounted on this opening. At the bottom of the baking furance 10 is a control panel 20 for regulating the treatment conditions within the furnace interior 21. On the bottom surface of the baking furnace 10 are mounted casters 30 and adjustable bolts 31 which serve as adjustable-length legs and enable the height of the furnace 10 to be raised or lowered as necessary.

During baking treatment, air (indicated by the arrows 24) which is heated by the heater 16 rises upwards from the bottom of the duct 15, passes through the filter 14, and is blown through the air discharge port into the furnace interior 21 by the air blower 13. Wafers 5 within the TF cassette 1 which is mounted on one of the racks 22 within the furnace interior 21 are treated by the hot air thus supplied. The hot air passes through the air intake port 23 provided at the bottom of the furnace interior 21, flows past the heater 16, and is reheated.

During baking treatment, the temperature within the furnace interior 21 is generally about 70-250 degrees C., and treatment is usually performed for about 20-60 minutes. In order to perform treatment using a baking furnace 10, usually a wafer 5 which was treated in a previous step is inserted into a polypropylene cassette (hereinunder referred to as a "PP cassette"), transported to the baking furnace 10, and then transferred to a TF cassette 1 immediately prior to baking treatment. The door 18 of the baking furnace 10 is manually opened, a prescribed number of TF cassettes 1 are placed on the racks 22 using a special jig, the door 18 is manually closed, and baking treatment is performed for a prescribed length of time. The hot TF cassettes 1 are then removed from the furnace interior 21 using a jig, and the wafers 5 are allowed to cool in the TF cassettes 1 for about 20-40 minutes until they reach room temperature. Next, the wafers 5 are transferred either manually or by a special automatic transferring machine to a PP cassette or to another TF cassette, depending on what the next step in manufacture is.

After baking treatment, unless a wafer 5 is cooled below a prescribed temperature, the treatment conditions in the succeeding steps and the quality of the wafer 5 are affected. Furthermore, it is necessary to allow a TF cassette 1 to cool after baking treatment because when it is in a hot state, the pitch of its slots 2 for wafers 5 is greater due to thermal expansion than the pitch of a cold PP cassette, and due to the difference in pitch it is difficult to transfer wafers 5 from a hot TF cassette to a cold PP cassette by an automatic transferring machine.

Conventionally, during cooling, wafers 5 are left in a hot TF cassette until both are cool. However, due to the heat capacity of the TF cassette, it takes a great deal of time for the wafers 5 to cool. Cooling a wafer 5 while it is still in a hot TF cassette is therefore an inefficient and time-consuming method.

A conventional baking furnace also has the drawback that it requires an extremely large door 18 to enable an operator to safely and easily insert and remove cassettes from the furnace interior 21. Because of the size of the door 18, a great deal of heat escapes from the furnace interior 21 each time the door 18 is opened, causing a drop in the temperature of the furnace interior. This results in a waste of heat and a loss of time while the furnace interior 21 is reheated in order to once again reach the appropriate temperature for baking treatment.

The opening and closing of such a large door also creates air turbulence which introduces dust and other foreign matter into the furnace interior 21. Also, as the length of time for which the door is opened depends on how quickly the operator can insert the cassettes, the fluctuation in temperature within the furnace varies from batch to batch, and it is difficult to obtain uniform treatment conditions.

SUMMARY OF THE INVENTION

It is an object of the present invention to provide an apparatus which can automatically perform baking treatment of semiconductor wafers.

It is another object of the present invention to provide an apparatus which can perform baking treatment more rapidly than is possible using a conventional baking furnace.

It is yet another object of the present invention to provide an apparatus for baking treatment which consumes less heat than a conventional baking furnace.

It is still another object of the present invention to provide an apparatus for baking treatment with which the baking conditions can be made uniform from batch to batch.

The present invention solves the above problems by the provision of a mechanism for automatically inserting and removing cassettes containing semiconductor wafers from a baking furnace, and by the provision of a mechanism for automatically transferring wafers from a hot cassette immediately after baking to another cassette which is kept at ambient temperature outside of the baking furnace. By automatically inserting and removing cassettes from a furnace, the portal in the baking furnace through which cassettes are inserted and removed can be reduced in size, with a reduction in the amount of heat which is lost each time the portal is opened. By immediately transferring hot wafers from a hot cassette to a cassette at ambient temperature after the completion of baking, the length of time required for the wafers to cool can be greatly decreased.

An apparatus for baking treatment according to the present invention comprises a furnace portion and a conveyor portion. The furnace portion is equipped with a baking furnace having a portal which can be opened and closed by a sliding shutter, a mechanism for circulating hot air through the baking furnace, and a mechanism for moving baking cassettes for baking wafers along a closed path within the baking furnace and for supporting them during baking. The conveyor portion has an entrance and an exit and a mechanism for conveying cassettes for transporting wafers along a path between the engrance and the exit. It also has an insertion and removing mechanism for inserting and removing a baking cassette from the baking furnace via the portal, and a transferring mechanism for transferring wafers from a cassette for transporting to a baking cassette and vice versa.

In a preferred embodiment, the mechanism for moving the cassettes for baking along a closed path within the furnace comprises a turntable equipped with supports for baking cassettes. The turntable is rotated by a motor and optionally by a hand crank.

The operation of the apparatus is controlled by a CPU in a manner such that immediately after baking is completed in the furnace portion, a baking cassette is removed from the furnace portion and the wafers contained therein are transferred to a cassette for transporting which is at ambient temperature in the conveyor portion.

A cooling mechanism for cooling the wafers comprising a conduit for a cooling gas and a gas discharge port may be employed to cool the wafers after baking as they are transported to the exit of the conveyor portion after being transferred from a baking cassette to a cassette for transporting.

BRIEF DESCRIPTION OF THE DRAWINGS

FIG. 3b is a view of the same embodiment taken along Line II—II of FIG. 3a.

FIG. 4 is a diagram illustrating the movement of cassettes during the operation of the embodiment of FIG. 3a.

FIGS. 5a and 5b are a side elevation and a front elevation, respectively, of the first conveyor 201a of the embodiment of FIG. 3a.

FIGS. 7a through 7e are schematic views illustrating the operation of the cassette insertion and removing mechanism of the embodiment of FIG. 3a.

FIGS. 8a through 8i are schematic views illustrating the operation of a wafer transferring mechanism of the embodiment of FIG. 3a.

FIG. 9a is a plan view of a turntable stabilizing mechanism of the embodiment of FIG. 3a, FIG. 9b is a side elevation of the same, and FIG. 9c is a schematic plan view of a portion of a notch of the stabilizing disk of FIG. 9a.

In the drawings, the same reference numerals indicate the same or corresponding parts.

DESCRIPTION OF THE PREFERRED EMBODIMENTS

Figure 3A:
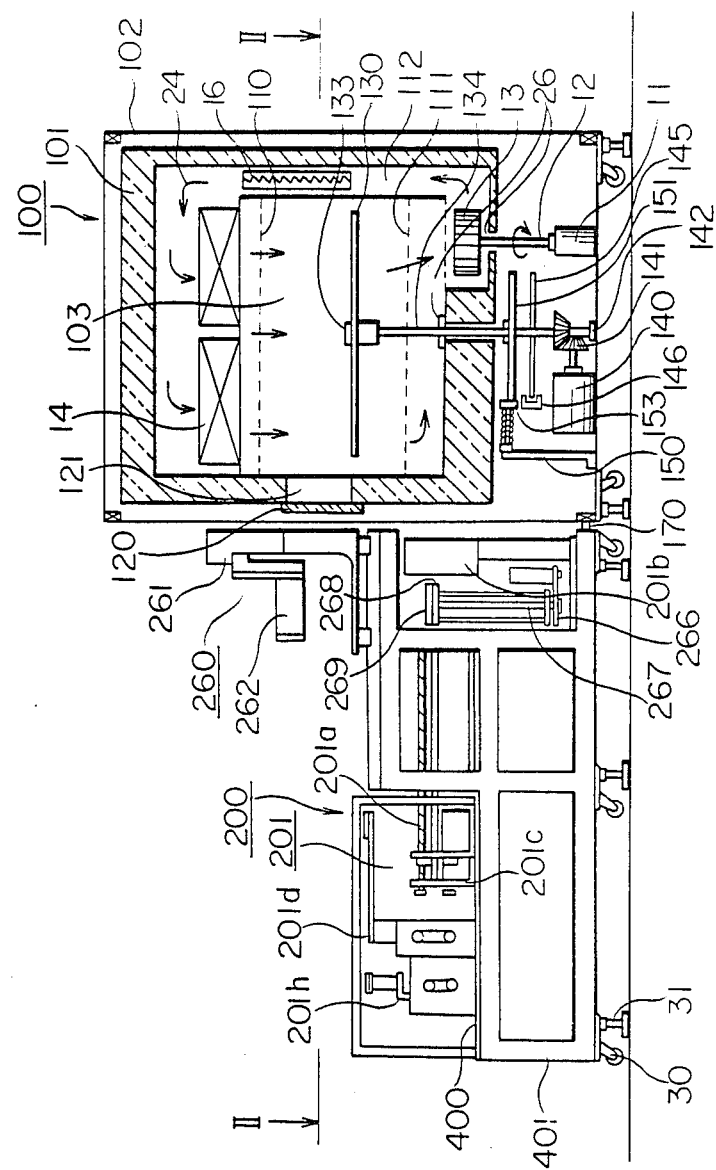
FIG. 3a is a longitudinal side view which is partially in cross section of an embodiment of an apparatus for baking treatment according to the present invention.
Figure 3B:
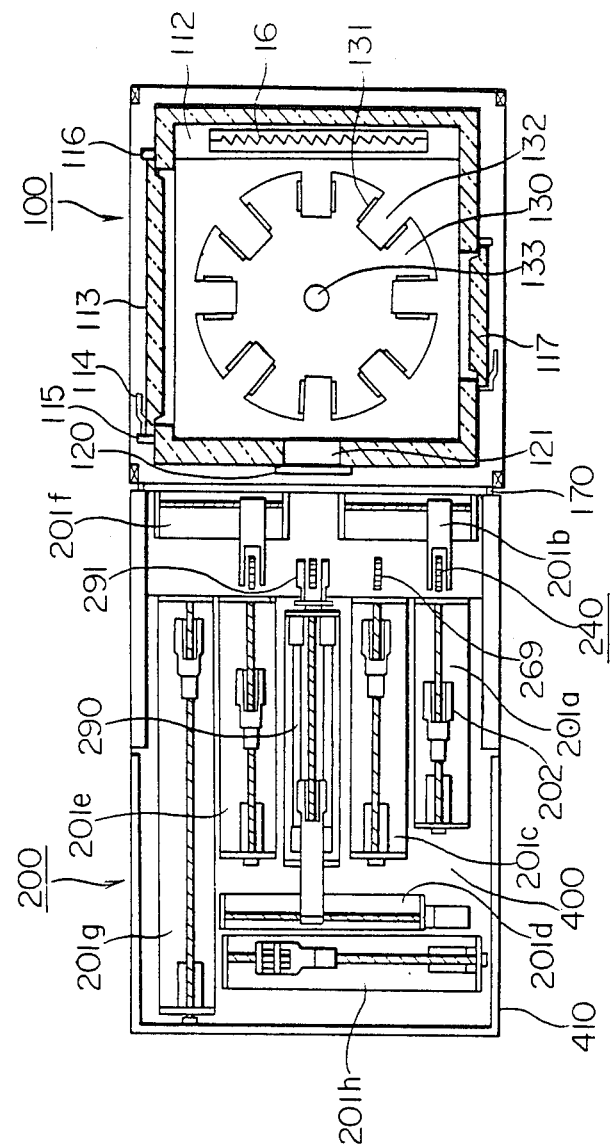

Hereinbelow, a preferred embodiment of the present invention will be described while referring to FIGS. 3 through 9 of the accompanying drawings. The overall structure of this embodiment is illustrated in FIGS. 3a and 3b, FIG. 3a being a partially cross-sectional side view and FIG. 3b being a view taken along Line II—II of FIG. 3a.

As shown in the figures, the apparatus comprises a furnace portion 100 and a conveyor portion 200. The furnace portion 100 has a furnace body 101 which is enclosed in a housing 102. The walls of the furnace body 101 are formed of a thermally-insulating material. At the center of the furnace body 101 is a baking chamber 103 where baking treatment of wafers is performed. At the bottom of the furnace body 101, beneath the baking chamber 103, is an air blower 13 for circulating hot air through the baking chamber 103. The air blower 13 is driven by a motor 11 which is mounted on the bottom of the furnace housing 102. The motor 11 is drivingly connected to the air blower 13 by a rotating shaft 12 which passes through a hole formed in the bottom surface of the furnace body 101. A seal 26 is installed in the gap between the shaft 12 and the wall of the furnace body 101 so as to prevent hot air from leaking from the baking chamber 103 to the outside. The air blower 13 is positioned in the middle of a duct 112 which extends upwards from below the baking chamber 103 to above it in a space between the baking chamber 103 and one wall of the furnace body 101. A heater 16 is installed approximately midway along the duct 112 so as to heat air passing through the duct 112. Air filters 14 are provided at the top end of the duct 112 above the baking chamber 103. The upper end of the duct 112 communicates with the upper end of the baking chamber 103 via an air discharge port 110. The discharge port 110 consists of a perforated plate or a grate and is equipped with a mechanism for adjusting air flow such as a register whose degree of opening can be adjusted in order to produce vertical, laminar flow of hot air through the baking chamber 103 and to regulate the air flow.

A turntable 130 on which unillustrated cassettes are mounted is disposed in the middle of the baking chamber 103. As shown in FIG. 3b, the turntable 130 has eight holes 132 formed in it at regular intervals, and the sides of each hole 132 are equipped with cassette support members 131 which can support a cassette during baking treatment. It is thus possible to simultaneously bake eight lots of wafers contained in eight cassettes. Although not provided in this embodiment, it may be desirable to form air passage holes in the turntable 130 so that air can freely flow therethrough, helping to maintain the laminar flow of air through the baking chamber 103. The turntable 130 is secured to a turntable drive shaft 134 by a suitable fastener 133. The bottom end of the turntable drive shaft 134 is supported by a thrust bearing 142 which is secured to the bottom of the furnace housing 102, and it is connected to a motor 140 through gears 141 so that it can be rotated by the motor 140. The drive shaft 134 passes through a hole in the bottom of the furnace body 101, and a seal 26 is provided around the hole to prevent hot air from leaking through it. A stabilizing disk 151 of a turntable stabilizing mechanism 150 is secured to the portion of the turntable drive shaft 134 which is below the furnace body 101. The turntable stabilizing mechanism 150 has a roller 153 which is pressed against the outer periphery of the stabilizing disk 151. The structure of this stabilizing mechanism 150 will be described in detail further on. A turntable position detector comprising a photosensor 146 and a disk 145 mounted on the turntable drive shaft 134 is provided below the stabilizing disk 151. The photosensor 146 is mounted on an unillustrated stationary support member with the periphery of the disk 145 extending into the gap of the photosensor 146. The disk 145 can be one which projects or blocks light.

The baking chamber 103 communicates with the duct 112 via an air intake port 111 provided at the bottom of the baking chamber 103. Like the air discharge port 110, the air intake port 111 comprises a perforated plate or a grate and is equipped with an adjusting mechanism such as a register for producing laminar flow of hot air through the baking chamber 103 and for regulating the air flow through the intake port 111.

As shown in FIG. 3b, the furnace body 101 has openings formed in three of its sides. A cassette portal 121 is formed in the wall facing the conveyor portion 200. The portal 121 can be opened and shut by a vertically-moving shutter 120 which is installed on the outside of the furnace body 101. Larger openings are formed in the front and rear surfaces of the furnace body 101, and these are closed by a front door 117 and a rear door 113. Each door is mounted on hinges 116 and is equipped with a handle 114 and a latch 115 so that the door can be secured in the closed position. During operation of the apparatus, the front door 117 and the rear door 113 are kept closed, and cassettes are inserted into and removed from the baking chamber 103 via the cassette portal 121.

The conveyor portion 200 comprises a cassette conveying mechanism 201, a wafer orientation adjusting mechanism 240, a wafer transferring mechanism 260, and a cassette insertion and removing mechanism 290. The operation of these 4 mechanism is controlled by an unillustrated CPU. They are supported by a stand 410 and a base plate 400 which is mounted on the stand 410. Like the furnace housing 102, the stand 410 has casters 30 and adjustable bolts 31 which serve as adjustable-length legs secured to its bottom portion. After being properly aligned, the conveyor portion 200 and the furnace portion 100 are rigidly connected with one another by connectors 170.

As shown in FIG. 3b, the cassette conveying mechanism 201 comprises first through eighth conveyors 201a through 201h, respectively. Each of the conveyors can convey a cassette in a straight line in the horizontal direction and can also raise and lower the cassette. The first conveyor 201a, the third conveyor 201c, the fifth conveyor 201e, and the seventh conveyor 201g are used for moving cassettes in the longitudinal direction of the apparatus (towards and away from the furnace portion 100), while the second conveyor 201b, the fourth conveyor 201d, the sixth conveyor 201f, and the eighth conveyor 201h are used for moving cassettes in the widthwise direction of the apparatus.

Figure 1:
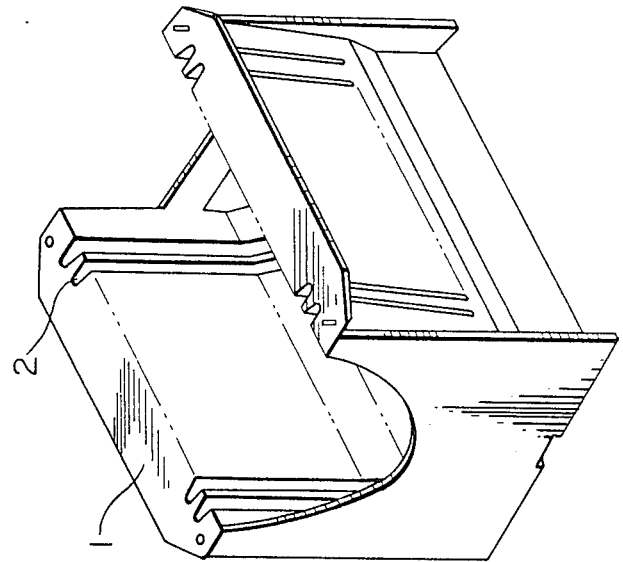
FIG. 1 is a perspective view of a conventional cassette for use in baking treatment of semiconductor wafers.

The basic structure of the conveyors is shown in detail in FIGS. 5a and 5b, which are respectively a side elevation and a front elevation of the first conveyor 201a. At its upper portion, the conveyor 201a has a horizontal C-shaped plate 203 to which a pair of cassette supports 202 are rigidly secured by screws 232. The casette supports 202 are spaced apart by the width of the bottom portion of a conventional cassette for wafers like that illustrated in FIG. 1 and are designed to support such a cassette from below. The horizontal plate 203 is rigidly supported by two vertical plates 204 which are in turn secured to another horizontal plate 205. A cassette resting on the cassette supports 202 can be moved up and down by a pneumatic cylinder 206 which ridigly supports the horizontal plate 205. This up and down movement is guided by two guide cylinders 233 having guide rods 234 slidably disposed therein. The speed of operation of the pneumatic cylinder 206 can be controlled by a speed controller 207 installed on the air supply line 208 of the pneumatic cylinder 206.

The pneumatic cylinder 206 and the guide cylinders 233 are vertically disposed on and rigidly secured to a horizontal installation plate 209, which in turn is secured to the horizontal portion of an L-shaped base 210. The vertical portion of the base 210 is secured to a translating block 212 by screws 211. The translating block 212 is mounted on a rotating ball screw 213 which serves as a feed screw, and on a pair of stationary guide rods 216, each of which passes through the block 212. The block 212 has a ball bearing 214 mounted therein which is engaged with the ball screw 213 so that the rotation of the ball screw 213 will force the block 212 to move along the length of the ball screw 213.

The ends of the ball screw 213 are rotatably supported by a pair of vertical end plates 224 whose bottom ends are secured to a base plate 225. The ends of the guide rods 216 are secured to the end plates 224. One end of the ball screw 213 has a pulley 235 rigidly mounted thereon. This ulley 235 is connected by a drive belt 236 to another pulley 235 which is rigidly secured to the output shaft of a reversible motor 217 which is secured to one of the end plates 224. When the motor 217 is operated, the rotation of its output shaft is transmitted to the ball screw 213 by the pulleys 235 and the drive belt 236, causing the block 212 to translate along the ball screw 213 in a direction corresponding to the direction of rotation of the motor 217.

At suitable locations along the length of the conveyor 201a, support frames 222 are secured to the base plate 225 by screws 223. Each support frame 222 includes a pair of horizontal rods on which is disposed a movable jig 221 which can be moved along the rods and secured thereto at a suitable position. The jig 221 rigidly supports a photosensor 220b. The photosensor 220b detects the presence of an L-shaped light-blocking plate 218 which is secured to the block 212 by screws 219. When the light-blocking plate 218 passes through the gap in the photosensor 220b, the photosensor 220b produces an electrical output signal which is used to control the starting or stopping of the motor 217.

The block 212, the ball screw 213, and the guide rods 216 are protected from dust and falling objects by a cover 226 which extends between the two end plates 224 and is secured thereto by screws 227. The cover 226 has a longitudinally-extending opening formed in its upper surface for the L-shaped base 210 to pass through.

As shown in FIGS. 5a and 5b, the conveyor 201a is disposed beneath and in parallel with two L-shaped rails 230 which are supported at intervals by pillars 231 which are secured to the base plate 225. At a number of locations, a pair of horizontal support plates 229 are secured to the rails 230 on both sides, and a pair of cassette supports 228 are press-fit onto the horizontal support plates 229. The cassette supports 228 are designed to support a conventional cassette like that illustrated in FIG. 1 from both sides by the longitudinally-extending flanges which are formed on the upper portions of the cassette and which rest on the cassette supports 228. A photosensor 220a for detecting the presence of a cassette on the cassette supports 228 is secured to the bottom side of one of the horizontal support plates 229.

Conveyors 201c, 201e, and 201g each have the same basic structure as the first conveyor 201a illustrated in FIGS. 5a and 5b. Conveyors 201b, 201d, 201f, and 201h also have a similar structure to conveyor 201a, but differ in that the upper portion which supports a cassette (corresponding to members 202 and 203 in FIG. 5a) extends in the direction perpendicular to the ball screw so that when a cassette is being transported in the widthwise direction of the apparatus, the longitudinal axis of the cassette will still point in the lengthwise direction of the apparatus.

Figure 4:
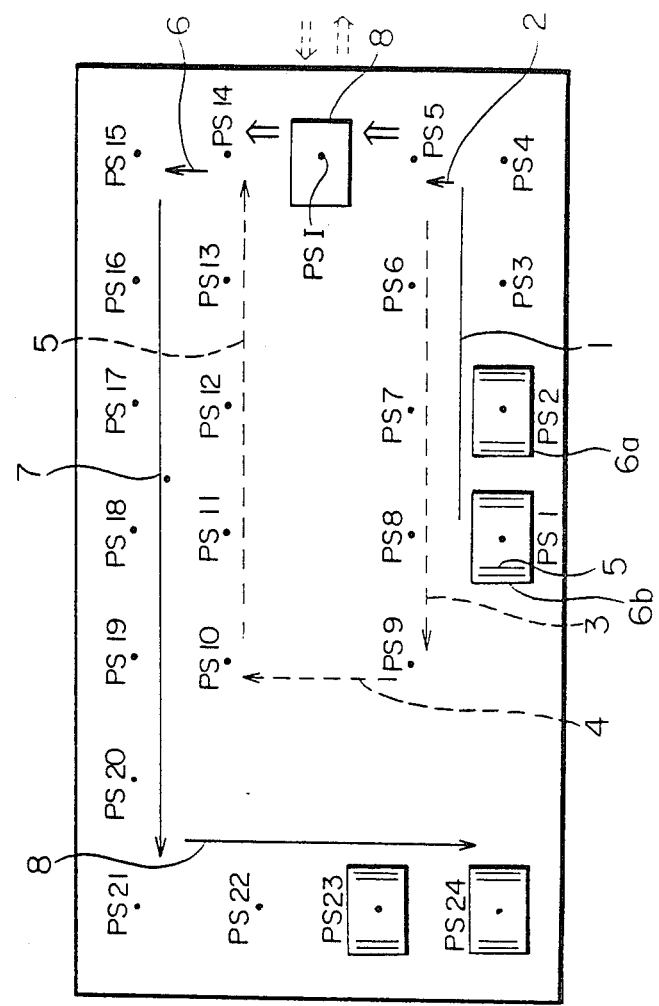

Next, the operation of the cassette transporting mechanism 201 will be described while referring to FIG. 4, which illustrates schematically the movement of cassettes inside the conveyor portion 200. In FIG. 4, the narrow solid arrows show the movement of cassettes containing wafers, the narrow dashed arrows show the movement of empty cassettes, the broad solid arrows show the movement of wafers when being transferred from one cassette to another, and the broad dashed arrows show the movement of a TF cassette into and out of the furnace portion 100. The case will be described in which two lots of wafers initially contained in two cassettes 6a and 6b are simultaneously treated. In the drawing, PS1 through PS24 indicate the positions of the cassettes during the various states of operation of the apparatus. PSI indicates an intermediate position from which a TF cassette for baking is inserted into the furnace portion 100. Positions PS1 and PS2 are located at the entrance of the conveyor portion 200 through which cassettes are inserted, and positions PS23 and PS24 are located at the exit thereof through which cassettes are removed from the conveyor portion 200. On both sides of each position are cassette supports 228 which are secured to rails 230 such as those shown in FIG. 5b so that if necessary a cassette can be mounted on the cassette supports 228 at that position and kept waiting there while another cassette is being moved.

To start with, a first PP cassette 6a containing wafers 5 to be baked is placed on the cassette supports 228 at position PS2 and a second PP cassette 6b also containing wafers 5 is placed on the cassette supports 228 at position PS1. These cassettes 6a and 6b are used solely for transporting wafers 5 within the conveyor portion 200, and they will therefore be referred to as transporting cassettes. The mounting of the transporting cassettes 6a and 6b is detected by the photosensors 220a mounted at each position. Each transporting cassette has an unillustrated light-blocking member secured thereto which activates the photosensor 220a when the transporting cassette is mounted on the corresponding cassette support 228. In response to the output from the photosensor 220a, the motor 217 of the first conveyor 201a is then turned on by an unillustrated CPU which controls the operation of the entire apparatus. The motor 217 rotates the ball screw 213 to cause the block 212 to translate towards position PS2. When the light-blocking plate 218 passes through the gap in the photosensor 220b mounted on the frame 222 near position PS2, the photosensor 220b sends an output signal to the CPU, which then shuts off the motor 217. The photosensor 220b for position PS2 is positioned such that when the motor 217 is shut off, the cassette supports 202 of the first conveyor 201a will be immediately below the first transporting cassette 6a which is mounted on the cassette supports 228 at position PS2. The same applies for the photosensors 220b at the other positions. If at the start of operations the light-blocking plate 218 is already interposed in the gap in the photosensor 220b for position PS2, the CPU will not start the motor 217.

When the cassette supports 202 are disposed below the cassette supports 228, the pneumatic cylinder 206 is then operated by the CPU to raise the horizontal plate 205 and the members secured thereto until the first transporting cassette 6a at position PS2 is lifted off the cassette supports 228 by the cassette supports 202 and supported thereby. The motor 217 is then turned on again to move the block 212 towards position PS4. When the light-blocking plate 218 passes through a gap in a photosensor 220b located at position PS4, the motor 217 is turned off again with the first transporting cassette 6a located between and above the cassette supports 228 at position PS4. The pneumatic cylinder 206 is then operated to lower the first transporting cassette 6a until it rests on the cassette supports 228 at position PS4.

Next, the motor 217 is operated in the reverse direction until the block 212 reaches position PS1. In the same manner as above, the pneumatic cylinder 206 is operated to lift up the second transporting cassette 6b from the cassette supports 228 at position PS1 and the second transporting cassette 6b is transported to position PS3 and deposited on the cassette supports 228 at that position. After depositing the second transporting cassette 6b at position PS3, the motor 217 is operated to return the block 212 to a previously-determined initial position.

Figure 6A:
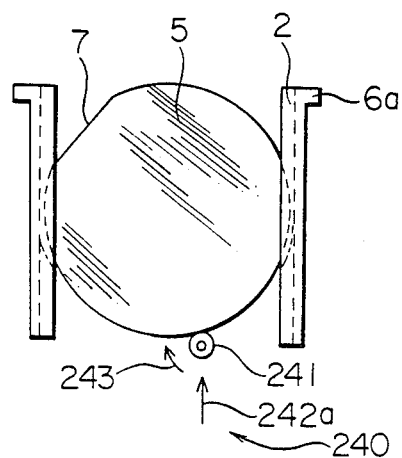
FIGS. 6a and 6b are end views of a cassette containing a wafer, schematically illustrating the operation of a mechanism for adjusting the orientation of wafers so that their flat portions all face in the same direction.
Figure 6B:
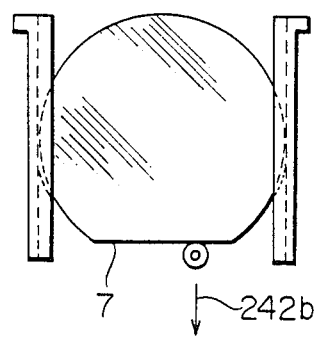

At position PS4, the wafers 5 in the first transporting cassette 6a are arranged so that their flat portions 7 all face in the same direction by the wafer orientation adjusting mechanism 240, the operation of which will be described while referring to FIG. 6. The wafer orientation adjusting mechanism 240 is disposed so as not to interfere with the movement of the first conveyor 201a or the second conveyor 201b. It comprises a long roller 241 extending for substantially the entire length of a cassette, an unillustrated device for rotating the roller 241, and an unillustrated device for raising and lowering the roller 241. The roller is made of a material such as Teflon or vinyl chloride which can not injure the wafers 5 by contact therewith. When the first transporting cassette 6a is mounted on the cassette supports 228 at position PS4, the raising and lowering device raises the roller 241 in the direction of arrow 242a until the roller 241 contacts all the wafers 5 in the cassette 6a and slightly lifts them up so that their weight is supported by the roller 241 as shown in FIG. 6a. The roller 241 is then rotated for a few seconds by the rotating device in the direction of arrow 243. As a result of this rotation, the wafers 5 within the cassette 6a are rotated in the counterclockwise direction in the figure until the flat portion 7 of each wafer 5 faces downwards as shown in FIG. 6b. When the wafer 5 reaches this state, the roller 241 loses contact with the wafers 5 since the diameter of the wafers 5 is a minimum at the flat portions 7. The further rotation of the roller 241 produces no further rotation of the wafers 5, and the wafers 5 are supported by the grooves 2 in the first transporting cassette 6a. The raising and lowering device then lowers the roller 241 in the direction of arrow 242b and returns the roller 241 to its original position.

After the wafers 5 in the first transporting cassette 6a have been arranged so that their flat portions 7 point in the same direction, the first transporting cassette 6a is transferred from position PS4 to position PS5 by the second conveyor 201b, which operates in a similar manner to the first conveyor 201a. When the first transporting cassette 6a has been moved from position PS4 to position PS5, the first conveyor 201a then moves the second transporting cassette 6b from position PS3 to position PS4, where the wafers 5 in the second transporting cassette 6b are arranged in the same manner as were the wafers 5 in the first transporting cassette 6a so that their flat portions 7 all face downwards.

The turntable 130 of the furnace portion 100 has mounted thereon a number of empty TF cassettes 8. In the present invention, these TF cassettes 8 are kept within the baking chamber 103 at almost all times and are used only for holding wafers 5 during baking. They will therefore be referred to as baking cassettes. One of these baking cassettes 8 is removed from the baking chamber 103 by the cassette insertion and removal mechanism 290 which is illustrated schematically in FIG. 7. The cassette insertion and removal mechanism 290 has a pair of cassette supports 291 which are secured to one end of a translating rod 293. The cassette supports 291 are designed to support a baking cassette 8 from below. One end of the rod 293 is slidably supported by a linear motion bearing 292 while the other end is secured to a translating block 295. The block 295 is mounted on a feed screw in the form of a ball screw 294 which is engaged with the block 295 so that when the ball screw 294 is rotated, the block 295 is moved along the length of the ball screw 294. The ball screw 294 is rotatably supported by vertical end plates 301 which are secured to a horizontal base 300. One end of the ball screw 294 has a pulley 297 rigidly mounted thereon. A reversible motor 296 is secured to the base 300 with its output shaft extending through one of the end plates 301. A pulley 297 is mounted on the output shaft of the motor 296, and this pulley 297 is connected with the other pulley 297 by a drive belt 298. The base 300 has a support frame 302 secured to its upper portion, and the support frame 302 is secured to the ram of a pneumatic cylinder 299 which is mounted on the base plate 400 of the conveyor portion 200.

The operation of the cassette insertion and removal mechanism 290 is as follows. The shutter 120 of the furnace body 101 is automatically opened by being raised in the direction of arrow 122a by an unillustrated opening and closing mechanism. The motor 296 is then turned on and made to rotate in the direction of arrow 303a. The rotation of the motor 296 is transmitted to the ball screw 294 by the pulleys 297 and the drive belt 298. The rotation of the ball screw 294 causes the block 295 and the rod 293 to move together towards the furnace body 101 in the direction of arrow 304a, and the cassette supports 291 pass through the portal 121 and enter the baking chamber 103. When it is determined that the cassette supports 291 are positioned directly below a baking cassette 8 mounted on the turntable 130, the motor 296 is stopped, and the pneumatic cylinder 299 is then operated to raise the cassette supports 291 in the direction of arrow 305a. The cassette supports 291 pass through the hole 132 formed in the turntable 130 where the baking cassette 8 is supported and lift the baking cassette 8 vertically off the turntable 130. The motor 296 is then operated in the reverse direction (in the direction of arrow 303b), causing the baking cassette 8 to be carried out of the baking chamber 103 in the direction of arrow 304b. When it is determined that the cassette supports 291 and the cassette 8 have reached a prescribed position which is detected by a photosensor or the like, the shutter 120 is automatically shut by being lowered in the direction of arrow 122b. The motor 296 is stopped when it is determined that the cassette 8 is positioned directly above position PSI. The pneumatic cylinder 299 is then operated to lower the cassette supports 291 in the direction of arrow 305b. As the cassette supports 291 are lowered, the cassette 8 is transferred to unillustrated stationary cassette supports at position PSI. In the above operations, the determination of the horizontal or vertical positions of the cassette supports 291 and of the shutter 122 can be performed by photosensors or other suitable detectors which provide electrical input signals to the CPU.

At position PS5, the first transporting cassette 6a is prevented from moving by an unillustrated restraining mechanism and the baking cassette 8 at position PSI is likewise restrained. The wafers 5 in the first transporting cassette 6a are then transferred to the baking cassette 8 at position PSI which was just removed from the furnace portion 100. The transferring of the wafers 5 is performed by the wafer transferring mechanism 260 shown in FIG. 3a and FIG. 8, the latter being an end view of the first transporting cassette 6a and a baking cassette 8 during transfer of wafers 5 from the one to the other. The transferring mechanism 260 has a support frame 261 which is mounted atop the stand 410 of the conveyor portion 200 and supports a wafer chuck 262. The frame 261 has mounted thereon an unillustrated motor by means of which the wafer chuck 262 can be moved in the widthwise direction of the conveyor portion 200. The wafer chuck 262 has a pair of jaws each comprising a comb 263 for grasping wafers 5 and a comb holder 264 to which the comb 263 is secured by a fastener 265. Each comb 263 extends for substantially the entire length of a cassette so that it can grasp all the wafers 5 in the cassette 6a at the same time. The combs 263 are made of Teflon or other material which will not mar the surfaces of the wafers 5. The wafer transferring mechanism 260 includes an unillustrated rotating device which can rotate the jaws about the centers of the fasteners 265. Mounted on the stand 410 below position PS5, position PSI, and position PS14 are three raising and lowering devices 266 which constitute part of the wafer transferring mechanism 260. Each of these devices 266 is equipped with a motor which can raise and lower a push rod 267. Atop each push rod 267 is mounted a comb holder 268 to which is secured a comb 269 which is used to support the wafers 5 in a cassette from below. Each comb 269 extends for substantially the entire length of a cassette and is made of a material such as Teflon which will not injure the wafers 5.

The operation of the wafer transferring mechanism 260 is as follows. Initially, the wafer chuck 262 is disposed above the empty baking cassette 8 at position PSI. It is then moved by the unillustrated motor in the direction of arrow 271a of FIG. 8b and is stopped above the first transporting cassette 6a at position PS5. The exact point at which to stop the wafer chuck 262 can be determined by a suitably disposed detector such as a photosensor. The push rod 267 below position PS5 is then raised by the raising and lowering device 266 in the direction of arrow 272a until the comb 269 contacts the flat portions 7 of all the wafers 5 in the first transporting cassette 6a. The push rod 267 continues to rise and lifts the wafers 5 vertically out of the first transporting cassette 6a. When the wafers 5 reach the level of the jaws of the wafer chuck 262, the push rod 267 is stopped. The comb holders 264 are then rotated by approximately 30 degrees about the fasteners 265 in the direction of arrows 273a so as to achieve a position in which the combs 269 can support the wafers 5 from below. The push rod 267 is then lowered in the direction of arrow 272b and the weight of the wafers 5 is transferred to the combs 263. The wafer chuck 262 is then moved sideways together with the wafers 5 in the direction of arrow 271b and is stopped directly above position PSI where the baking cassette 8 is mounted. The push rod 267 below position PSI is then raised in the direction of arrow 274a by the unillustrated raising and lower device 266 to which it is connected until the comb 269 contacts the flat portions 7 of the wafers 5. The jaws of the wafer chuck 262 are then rotated in the direction of arrows 273b about the fasteners 265 until the combs 263 return to their original vertical state, as a result of which the weight of the wafers 5 is transferred to the comb 269 mounted on the push rod 267. The push rod 267 is then lowered in the direction of arrow 274b, and by this movement the wafers 5 are transferred from the comb 269 to the grooves of the baking cassette 8 at position PSI.

When the transfer of wafers 5 from the first transporting cassette 6a to the baking cassette 8 is completed, the cassette restraining mechanism which restrained the cassettes at position PS5 and position PSI is released. The wafer chuck 262 of the wafer transferring mechanism 260 is then moved to above position PS5. The baking cassette 8 at position PSI which is now full of wafers 5 is inserted into the baking chamber 103 of the furnace portion 100 by the cassette insertion and removal mechanism 290 by a series of steps which are the reverse of those illustrated in FIG. 7.

The now empty first transporting cassette 6a at position PS5 is moved from position PS5 to position PS9 by the third conveyor 201c, from position PS9 to position PS10 by the fourth conveyor 201c, and from position PS10 to position PS14 by the fifth conveyor 201e. When it is mounted on the cassette supports at position PS14, it is again restrained by the unillustrated cassette restraining mechanism and remains there for the time being.

When position PS5 is vacated, the second conveyor 201b moves the second transporting cassette 6b from position PS4 to position PS5, and the cassette insertion and removal mechanism removes another empty baking cassette 8 from the turntable 130 of the furnace portion 100. In the same manner as described for the first transporting cassette 6a, the wafers 5 are transferred from the second transporting cassette 6b to the baking cassette 8 at position PSI, and the now full baking cassette 8 is inserted into the baking chamber 103 and mounted on the turntable 130. The second transporting cassette 6b is then moved from position PS5 to position PS13 by the third conveyor 201c, the fourth conveyor 201d, and the fifth conveyor 201e and remains there until position PS14 is vacated. Before the second transporting cassette 6b is moved from position PS5, the wafer chuck 262 is returned to above position PSI.

When the two baking cassettes 8 are mounted on the turntable 130, the shutter 121 of the furnace body 101 is closed, and baking treatment is then carried out for a prescribed period. During the baking period, the motor 140 of the turntable is controlled so as to make the turntable 130 perform one complete revolution. It can be controlled so as to rotate intermittently or continuously.

When baking cassettes 8 are loaded or unloaded from the turntable 130, it is important the the turntable 130 be stopped in exactly the right position so that the baking cassettes 8 can be transferred to or from the turntable 130 by the insertion and removal mechanism 290 without interference of parts. For this reason, the turntable stabilizing mechanism 150 is provided for stopping the turntable 130 at a prescribed position and for preventing the turntable 130 from deviating from this position due to backlash of the gears 141 or other cause. As shown in FIGS. 9a through 9c, the stabilizing mechanism 150 has a rigid stabilizing disk 151 which is secured to the drive shaft 134 of the turntable 130 so as to rotate therewith. The disk 151 has eight V-shaped notches 152 formed in its outer periphery at equal intervals. A roller 153 which is rotatably mounted on a roller shaft 154 is rigidly secured to a support plate 155. The support plate 155 is secured to the ends of a pair of sliding shafts 157. Each shaft 157 has a threaded portion on which an adjusting nut 156 is mounted. The shafts 157 are slidably mounted in linear motion bearings 159 which are secured to a vertical mounting plate 160. The end of each shaft 157 which extends through the linear motion bearing 160 has a nut 162 mounted on it which limits the movement of the shaft 157. A spring 158 is disposed around each shaft 157 with one end abutting against the adjusting nut 156 and the other end abutting against the linear motion bearing 159. The springs 158 are compressed between the adjusting nuts 156 and the linear motion bearings 159 and therefore exert a force on the adjusting nuts 156 which pushes the roller 153 outwards against the stabilizing disk 151. The force exerted by the springs 158 can be adjusted by changing the position of the adjusting nuts 156. The roller 153 is therefore always in rolling contact with the outer periphery of the disk 151. The bottom end of the mounting plate 160 is rigidly secured to the bottom of the furnace housing 102 by bolts 161. The disk 151 is accurately mounted on the drive shaft 134 of the turntable 130 so that when one of the holes 132 in the turntable 130 is exactly aligned with the portal 121 of the furnace body 101, the center of the roller 153 will coincide with the center of one of the notches 152.

The position at which the turntable 130 should be stopped is determined by the position detecting mechanism comprising the disk 145 and the photosensor 146. When one of the holes 132 in the turntable 130 is aligned with the portal 121, the photosensor 146 produces an output signal, and based on the output signal the unillustratd CPU stops the motor 140 for the turntable 130. At the point of stopping, the roller 153 fits into one of the V-shaped notches 152 in the stabilizing disk 151. Due to backlash of the gears 141 or manufacturing imprecision, when the motor 140 stops, a hole 132 in the turntable 130 may be slightly misaligned with the portal 121. In this case, as shown in FIG. 9c, the center of the roller 153 will not coincide with the center of the notch 152 into which it fits. However, the force of the springs 158 pressing the roller 153 against the sides of the notch 152 will exert a torque on the stabilizing disk 151, causing it to rotate until the center of the notch 152 coincides with the center of the roller 153. As the stabilizing disk 151 is rigidly secured to the drive shaft 134 of the turntable 130, the turntable 130 will be forced to rotate with the stabilizing disk 151 until one of the holes 132 in the turntable 130 is exactly aligned with the portal 121. The force exerted by the roller 153 on the notch 152 will then prevent the turntable 130 from deviating from this position until the motor 140 is again operated.

After the two lots of wafers 5 in the baking cassettes 8 have undergone baking treament for a prescribed length of time, one of the baking cassettes 8 is removed from the baking chamber 103 by the cassette inertion and removal mechanism 290 in the manner shown in FIG. 7 and is mounted on the cassette supports 228 at position PSI. the baking cassette 8 is restrained by the unillustrated restraining mechanism, and the hot wafers 5 contained therein are transferred by the wafer transferring mechanism 260 to the empty first transporting cassette 6a which is waiting at position PS14. The process by which wafers 5 are transferred from the baking cassette 8 to the first tranporting cassette 6a is identical to the process by which wafers 5 were earlier transferred from the first transporting cassette 6a to the baking cassette 8, as shown in FIG. 8.

After transfer of the wafers 5 is completed, the cassette restraining mechanism releases the first transporting cassette 6a and the baking cassette 8, and the now empty baking cassette 8 is returned to its original position on the turntable 130 by the cassette insertion and removalmechanism 290. The first transporting cassette 6a is then moved by the sixth conveyor 201f from position PS14 to position PS15. The fifth conveyor 201e then moves the second transporting cassette 6b from position PS13 to position PS14, and the cassette restraining mechanism restrains the second transporting cassette 6b at this position. The turntable 130 is rotated until the baking cassette 8 containing the second lot of wafers 5 is aligned with the portal 121, and the cassette insertion and removal mechanism 290 removes this cassette 8 from the turntable 130 and places it at position PSI. The second lot of wafers 5 is then transferred from the baking cassette 8 at position PSI into the second transporting cassette 6b at position PS14 in the same manner as for the first transporting cassette 6a. When the transfer of the wafers 5 is complete, the baking cassette 8 at position PSI is returned to its original position on the turntable 130 by the cassette insertion and removal mechanism 290. When the transfer of wafers 5 is being performed, the shutter 121 of the furnace body 101 is kept closed so as to maintain the temperature within the baking chamber 103.

While the wafers 5 are being transferred from the baking cassette 8 to the second transporting cassette 6b, the first transporting cassette 6a is moved from position PS15 to the exit portion at position PS24 by the seventh conveyor 201g and the eighth conveyor 201h. At position PS24, it is removed from the conveyor portion 200. Alternatively, if it is desired to remove the two lots from the apparatus simultaneously, the first transporting cassette 6a can be moved to position PS22 and left waiting there until the transfer of wafers 5 to the second transporting cassette 6b is completed. After the second transporting cassette 6b is moved from position PS14 to position PS21 by the sixth conveyor 201f and the seventh conveyor 201g, the first and second transporting cassettes 6a and 6b can be moved one at a time to position PS24 and position PS23, respectively, and then removed from the apparatus at the same time.

Thus, in the manner described above, an apparatus according to the present invention performs all the steps of baking treatment automatically without the need of a human operator.

In baking treatment using a conventional furnace, a wafer is cooled in a TF cassette after baking, and due to the heat capacity of the cassette, the wafers require a long time to cool. In the present invention, after baking treatment, wafers are immediately transferred to a PP cassette which is kept at room temperature. Thus, only the wafers themselves need be cooled, and the cooling time can be greatly shortened, resulting in a large increase in the number of wafers which can be treated per unit time.

In the illustrated embodiment, after being removed from the furnace portion 100, wafers 5 are cooled by natural cooling. However, it i9s also possible to employ a cooling mechanism for force-cooling the hot wafers 5 so as to further decrease cooling time. Such a mechanism could be a gas conduit which is connected to a source of a cooling gas such as nitrogen, the conduit being equipped with a gas discharge port which is disposed above the seventh conveyor 201g so as to blow cooling gas onto the hot wafers 5 as they are transported from position PS15 to position PS21.

Figure 2:
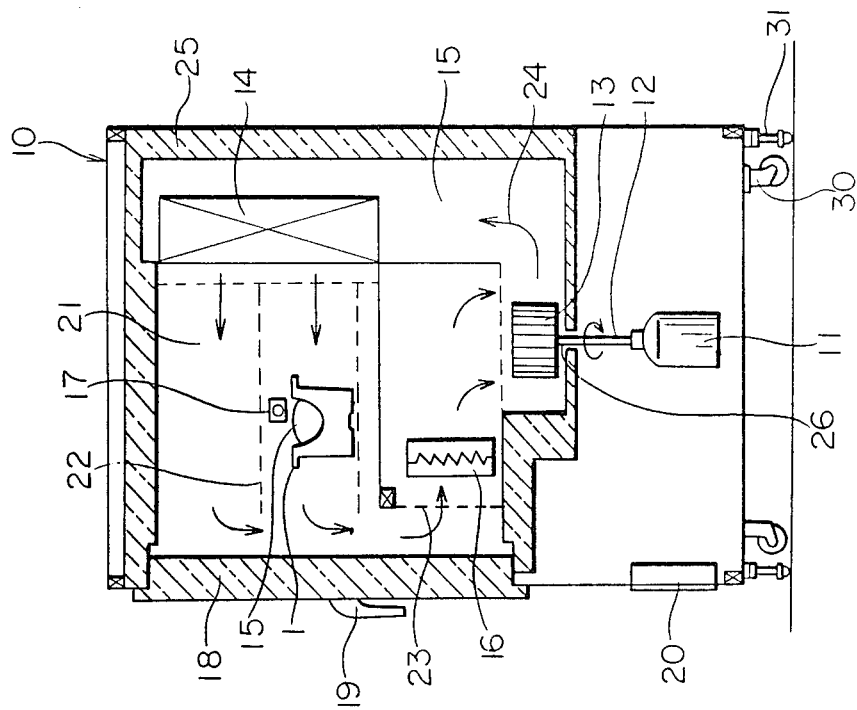
FIG. 2 is a vertical cross-sectional view in schematic form of a conventional baking furnace for semiconductor wafers.

In a conventional furnace such as that illustrated in FIG. 2, the door 18 of the furnace must be sufficiently large for a human operator to safely and easily insert cassettes, and as mentioned earlier, a large door has the drawbacks that a great deal of heat escapes each time the door is opened, the temperature within the baking furnace greatly fluctuates, it takes a long time for the temperature within the furnace to reach the prescribed level, and considerable dust can be introduced into the baking furnace each time the door is opened. In contrast, in the present invention, since baking cassettes are automatically inserted into a baking chamber 103 by a cassette insertion and removal mechanism 290, the portal 121 can be made much smaller than a door 18 for a human operator, with the result that the heat loss through the portal 121 is much smaller than with a conventional furnace and the fluctuation in the temperature within the baking chamber 103 is small. Thus, it requires less heat to maintain the temperature of the baking chamber 103 and it takes less time for the temperature within the baking chamber 103 to once again reach a predetermined level after the insertion of a cassette. In addition, the time for which the portal 121 is open can be made constant for each batch, and variation among batches due to differences in baking conditons can be decreased.

Conventionally, TF cassettes for baking are at room temperature when inserted into a baking furnace, and the heat capacity of the TF cassettes at room temperautre slows down the heating of the wafers 5. In the present invention, the TF baking cassettes 8 are outside of the baking chamber 103 for only short lengths of time and are therefore always warmer than room temperature. As a result, when wafers 5 are inserted into the baking chamber 103 in a TF baking cassette 8, it takes less time for the wafers 5 to be heated to a desired temperature. In addition, a separate storage area for baking cassettes 8 outside the furnace portion 100 is made unnecessary.

The illustrated embodiment is capable of treating 8 lots of wafers at the same time, but in the present invention there is no limit on the number of lots, which can be varied in accordance with need. The number of positions on the exit side of the conveyor portion 200 (positions PS14 through PS24) can also be varied. In the present embodiment, even though only 8 lots can be treated at one time, extra positions are provided in case some problem develops with the apparatus and cassettes have to be kept waiting in the conveyor portion 200 before being removed.

In the present embodiment, a motor 140 is used to automatically rotate the turntable 130. However, it is possible to in addition provide a clutch and a hand crank which extends outside of the furnace housing 102. In this case, the turntable drive shaft 134 can be connected either to the motor 140, enabling it to be automatically rotated, or to the hand crank, enabling it to be manually rotated. Various other mechanisms can be used for rotating the turntable 130. For example, if the turntable 130 need be rotated between only two positions, a pneumatic cylinder can be employed to rotate it.

At locations where simultaneous movement of the various parts of the conveyor portion 200 would result in interference, it is possible to employ interlocks.

The above embodiment was explained for the case in which two lots of wafers 5 were treated at the same time, but it can be used to treat anywhere from 1 to 8 lots simultaneously. Furthermore, by providing entrances to the conveyor portion 200 at positions PS1 through PS4 and exits at positions PS21 through PS24, it is possible to simultaneously insert and remove 4 lots from the conveyor portion 200.

What is claimed is:

1. An apparatus for baking treatment of semiconductor wafers contained in transporting cassettes and baking cassettes, said apparatus comprising:

a furnace portion including a baking furnace having a portal formed therein and equipped with means for opening and closing said portal to allow insertion and removal of a baking cassette holding semiconductor wafers, means for circulating hot air within said baking furance to provide sufficient heat for the baking treatment of the semiconductor wafers, and a movable member defining a support for a plurality of baking cassettes, each inserted into said furnace portion through said portal and holding semiconductor wafers, said movable member supporting the wafers for baking treatment and defining a closed path within said baking furnace along which the wafers travel while being baked upon movement of the member; and a conveyor portion having an entrance and an exit and including conveyor means receiving a transporting cassette holding semiconductor wafers and defining a transporting path between the entrance and the exit and through an intermediate wafer exchange position along which unbaked and baked wafers travel before and after baking, respectively, insertion and removal means for inserting and removing a baking cassette from said baking furnace through said portal to a portal position adjacent the wafer exchange position of a transporting cassette, and transferring means for transferring semiconductor wafers prior to baking from a transporting cassette at the wafer exchange position to a baking cassette at the portal position and for transferrng semiconductor wafers subsequent to baking from a baking cassette at the portal position to a transporting cassette in the transporting path whereby it is moved by said conveyor means to the exit.

2. An apparatus for baking treatment as claimed in claim 1 wherein said baking cassette moving means in said baking furnace comprises a turntable and a motor drivingly connected to said turntable.

3. An apparatus for baking treatment as claimed in claim 1 wherein a transporting cassette is kept in said conveyor portion at the ambient temperature of said conveyor portion, and a baking cassette is kept inside said baking furnace except during the transfer of wafers to or from it by said transferring means.

4. An appartus for baking treatment as claimed in claim 1, further comprising cooling means for cooling wafers subsequent to baking treatment and after the wafers have been transferred to a transporting cassette to be transported by said conveyor means from said transferring means to said exit of said conveyor portion.

5. An apparatus for baking treatment as claimed in claim 1, further comprising means for adjusting the orientation of the wafers in a transporting cassette, prior to their being transferred to a baking cassette, so that flat portions of said wafers all point in the same direction.

6. An apparatus for baking treatment of semiconductor wafers contained in transporting cassettes and baking cassettes, said apparatus comprising:

a furnace portion including a baking furnace having a portal formed therein and equipped with a shutter to open and close said portal means for circulating hot air within said baking furnace to provide for the baking treatment of semiconductor wafers, and baking cassette moving means for moving a baking cassette holding semiconductor wafers for baking along a closed path within said baking furnace;

a conveyor portion having an entrance and an exit and including conveyor means for conveying a transporting cassette holding semiconductor wafers along a path between said entrance and said exit, insertion and removal means for inserting and removing a baking cassette from said baking furnace through said portal and for mounting and removing said baking cassette from said baking cassette moving means, and transferring means for transferring wafers prior to baking from a transporting cassette to a baking cassette and for transferring wafers subsequent to baking from a baking cassette to a transporting cassette; and control means for controlling said furnace portion and said conveyor portion so that, when a transporting cassette containing wafers to be baked is placed on said conveyor means at the entrance of said conveyor portion, the transporting cassette is conveyed to said transferring means by said conveyor means, the wafers in the transporting cassette are then transferred to a baking cassette by said transferring means, the baking cassette is inserted into said baking furnace by said insertion and removal means, baking treatment is then carried out by said furnace portion for a prescribed length of time, and, when baking treatment within said baking furnace is completed, the baking cassette is removed from said baking furnace by said insertion and removal means, the wafers in the baking cassette are immediately transferred from the baking cassette to a transporting cassette by said transferring means while said wafers are still hot, and said wafers are transported to the exit of said conveyor portion by said conveyor means.

7. An apparatus for baking treatment of semiconductor wafers contained in transporting cassettes and baking cassettes, said apparatus comprising:
a furnace portion including a baking furnace having a portal formed therein and equipped with a shutter to open and close said portal means for circulating hot air within said baking furnace to provide for the baking treatment of semiconductor wafers, and baking cassette moving means comprising a turntable and a motor drivingly connected to said turntable for moving a baking cassette holding semiconductor wafers for baking along a closed path within said baking furnace;
a conveyor portion having an entrance and an exit and including conveyor means for conveying a transporting cassette holding semiconductor wafers along a path between said entrance and said exit, insertion and removal means for inserting and removing a baking cassette from said baking furnace through said portal and for mounting and removing said baking cassette from said baking cassette moving means, and transferring means for transferring wafers prior to baking from a transporting cassette to a baking cassette and for transferring wafers subsequent to baking from a baking cassette to a transporting cassette; and
means for detecting a receiving position at which said turntable of said baking cassette moving means should be stopped for presenting a baking cassette to or receiving a baking cassette from said insertion and removal means, and turntable stabilizing means for stopping said turntable exactly in the receiving position and for preventing said turntable from deviating from the receiving position until said motor is operated.

8. An apparatus for baking treatment as claimed in claim 7 wherein said baking cassette moving means further comprises a clutch connected between said turntable and said motor, and a hand crank extending to the outside of said furnace portion and connected to said turntable through said clutch so that said turntable can be rotated by either said motor or by said hand crank.

9. An apparatus for baking treatment of semiconductor wafers contained in transporting cassettes and baking cassettes, said apparatus comprising:
a furnace portion including a baking furnace having a portal formed therein and equipped with a shutter to open and close said portal means for circulating hot air within said baking furnace to provide for the baking treatment of semiconductor wafers, and baking cassette moving means for moving a baking cassette holding semiconductor wafers for baking along a closed path within said baking furnace;
a conveyor portion having an entrance and an exit and including conveyor means for conveying a transporting cassette holding semiconductor wafers along a path between said entrance and said exit, insertion and removal means for inserting and removing a baking cassette from said baking furnace through said portal and for mounting and removing said baking cassette from said baking cassette moving means, and transferring means for transferring wafers prior to baking from a transporting cassette to a baking cassette and for transferring wafers subsequent to baking from a baking cassette to a transporting cassette; and
cooling means for cooling wafers subsequent to baking treatment after they have been transferred to a transporting cassette to be transported by said conveyor means from said transferring means to the exit of said conveyor portion;
said cooling means comprising a gas conduit, means for blowing a cooling gas through said gas conduit, and a gas discharge port which is formed in said gas conduit between said transferring means and the exit of said conveyor portion and which is disposed so as to discharge the cooling gas onto a transporting cassette as it is being conveyed by said conveyor means.

10. An apparatus for baking treatment of semiconductor wafers contained in transporting cassettes and baking cassettes, said apparatus comprising:
a furnace portion including a baking furnace having a portal formed therein and equipped with a shutter to open and close said portal means for circulating hot air within said baking furnace to provide for the baking treatment of semiconductor wafers, and baking cassette moving means for moving a baking cassette holding semiconductor wafers for baking along a closed path within said baking furnace;
a conveyor portion having an entrance and an exit and including conveyor means for conveying a transporting cassette holding semiconductor wafers along a path between said entrance and said exit, insertion and removal means for inserting and removing a baking cassette from said baking furnace through said portal and for mounting and removing said baking cassette from said baking cassette moving means, transferring means for transferring wafers prior to baking from a transporting cassette to a baking cassette and for transferring wafers subsequent to baking from a baking cassette to a transporting cassette; and
means for adjusting the orientation of the wafers in a transporting cassette prior to their being transferred to a baking cassette so that flat portions of the wafers all point in the samw direction;
said means for adjusting the orientation of wafers comprising a roller, means for raising and lowering the roller so as to move it into contact with the wafers contained in a transporting cassette, and means for rotating said roller about the axis of said roller.

* * * * *